US008422180B2

(12) United States Patent
Lin et al.

(10) Patent No.: US 8,422,180 B2
(45) Date of Patent: Apr. 16, 2013

(54) HIGH-VOLTAGE-TOLERANT ESD CLAMP CIRCUIT WITH LOW LEAKAGE CURRENT FABRICATED BY LOW-VOLTAGE CMOS PROCESS

(75) Inventors: Chun-Yu Lin, Hualien County (TW); Ming-Dou Ker, Hsinchu County (TW); Fu-Yi Tsai, Hsinchu (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 274 days.

(21) Appl. No.: 12/641,037

(22) Filed: Dec. 17, 2009

(65) Prior Publication Data
US 2011/0149449 A1 Jun. 23, 2011

(51) Int. Cl.
*H02H 9/00* (2006.01)
(52) U.S. Cl.
USPC .......................................................... 361/56
(58) Field of Classification Search ...................... 361/56
See application file for complete search history.

(56) References Cited

U.S. PATENT DOCUMENTS

| 5,956,219 | A | 9/1999 | Maloney | |
|---|---|---|---|---|
| 6,862,160 | B2 | 3/2005 | Maloney et al. | |
| 7,529,070 | B2 * | 5/2009 | Bhattacharya et al. | 361/56 |
| 7,545,614 | B2 * | 6/2009 | Traynor et al. | 361/56 |
| 7,586,721 | B2 * | 9/2009 | Wang et al. | 361/56 |
| 7,764,476 | B2 * | 7/2010 | Ker et al. | 361/56 |
| 7,782,580 | B2 * | 8/2010 | Gauthier et al. | 361/56 |
| 8,243,404 | B2 * | 8/2012 | Ker et al. | 361/56 |
| 2008/0049365 | A1 * | 2/2008 | Worley et al. | 361/56 |
| 2009/0015974 | A1 | 1/2009 | Wang et al. | |

FOREIGN PATENT DOCUMENTS

| CN | 1663091 | 8/2005 |
|---|---|---|
| CN | 101506976 | 8/2009 |

OTHER PUBLICATIONS

Article Titled "Design of high-voltage-tolerant ESD protection circuit in low-voltage CMOS processes", authored by Ker et al, in IEEE, Transactions on Device and Materials Reliability, vol. 9, No. 1, Mar. 2009.
"First Office Action of China counterpart application" issued on Nov. 15, 2012, p. 1-p. 6, in which the listed references were cited.

* cited by examiner

*Primary Examiner* — Rexford Barnie
*Assistant Examiner* — Ann Hoang
(74) *Attorney, Agent, or Firm* — Winston Hsu; Scott Margo (57) ABSTRACT

An electrostatic discharge (ESD) clamp circuit is provided, which includes a plurality of identical module circuits. The anode of the first module circuit is coupled to the cathode of the ESD clamp circuit. The anode of each of the other module circuits is coupled to the cathode of the previous module circuit. The cathode of the last module circuit is coupled to the ground terminal of the ESD clamp circuit. Each module circuit includes a conduction path and a detection circuit. The detection circuit is coupled to the anode, the cathode and the conduction path of the module circuit. When the rising speed of the voltage at the anode of the module circuit surpasses a threshold value, the detection circuit makes the conduction path conducting.

14 Claims, 10 Drawing Sheets

HIGH-VOLTAGE-TOLERANT ESD CLAMP CIRCUIT WITH LOW LEAKAGE CURRENT FABRICATED BY LOW-VOLTAGE CMOS PROCESS

BACKGROUND OF THE INVENTION

1. Field of the Invention

The invention relates to an electrostatic discharge (ESD) clamp circuit, and more particularly to a high-voltage-tolerant ESD clamp circuit with low leakage current fabricated by low-voltage CMOS process.

2. Description of Related Art

General ESD clamp circuit is configured between the power terminal and the ground terminal of the electronic system. When the electronic system operates normally, the ideal ESD clamp circuit is required to be completely turned off without any leakage current. If the ESD pulse occurs, the ESD clamp circuit is required to be conductive to conduct the ESD pulse from the power terminal to the ground terminal to protect the electronic system.

In nanometer complementary metal oxide semiconductor (CMOS) process, the gate oxide is getting thinner with the evolution of the process technology, and the operation voltage is also decreasing. However, in an electronic system, there are usually several subsystems operating in different operation voltages. In order to make the integrated circuit be adapted to different operation voltages, in conventional method, high-voltage-tolerant subsystems are fabricated with the thicker gate oxide to prevent the gate oxide from electrical overstress (EOS). However, adding an additional mask during the fabricating process to fabricate the thick gate oxide increases the complexity of the process so that the yield decreases and the entire production cost increases.

To lower the production cost, the high-voltage-tolerant circuit fabricated by low-voltage CMOS process with the thin gate oxide is already a hot research topic, and so is the ESD clamp circuit.

Figure 1:
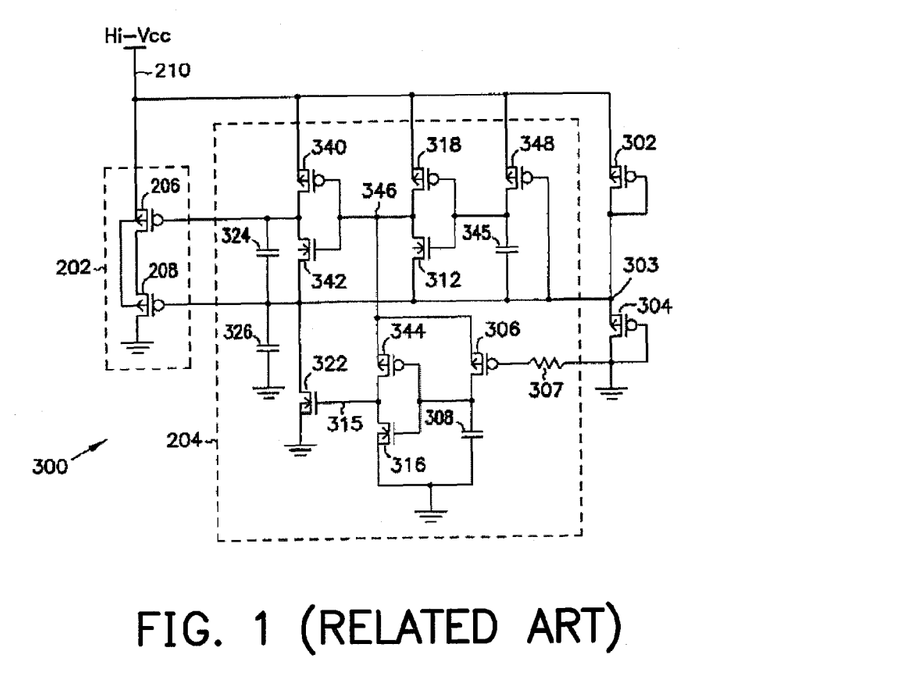
FIG. 1-3 show the circuit diagrams of three conventional ESD clamp circuit.

FIG. 1 shows a circuit diagram of a conventional ESD clamp circuit. The ESD clamp circuit in FIG. 1 is fabricated by low-voltage CMOS process. If the low-voltage elements can only endure an operation voltage which is VDD, the circuit in FIG. 1 can endure an operation voltage which is two times of VDD. That is to say, the operation voltage Hi-Vcc provided by power terminal 210 is two times of VDD.

The ESD clamp circuit in FIG. 1 is divided into three parts: the discharge path 202, the control circuit 204, and the voltage divider including the p-channel metal oxide semiconductor field effect transistors (PMOS transistor) 302, 304. The PMOS transistors 302, 304 are diode-connected. Such voltage divider divides the operation voltage Hi-Vcc into two equal segments such that the voltage across the power terminal 210 and the node 303 equals to VDD and so does the voltage across the node 303 and the ground terminal. Therefore, each of the low-voltage elements in the circuit in FIG. 1 can operate normally without suffering from EOS.

The control circuit 204 turns off the PMOS transistors 206, 208 to cut off the discharge path 202. If the ESD pulse occurs at the power terminal 210, the control circuit 204 turns on the PMOS transistors 206, 208, thereby completing the discharge path 202 to conduct the ESD pulse to the ground terminal for protecting the electronic system.

Figure 2:
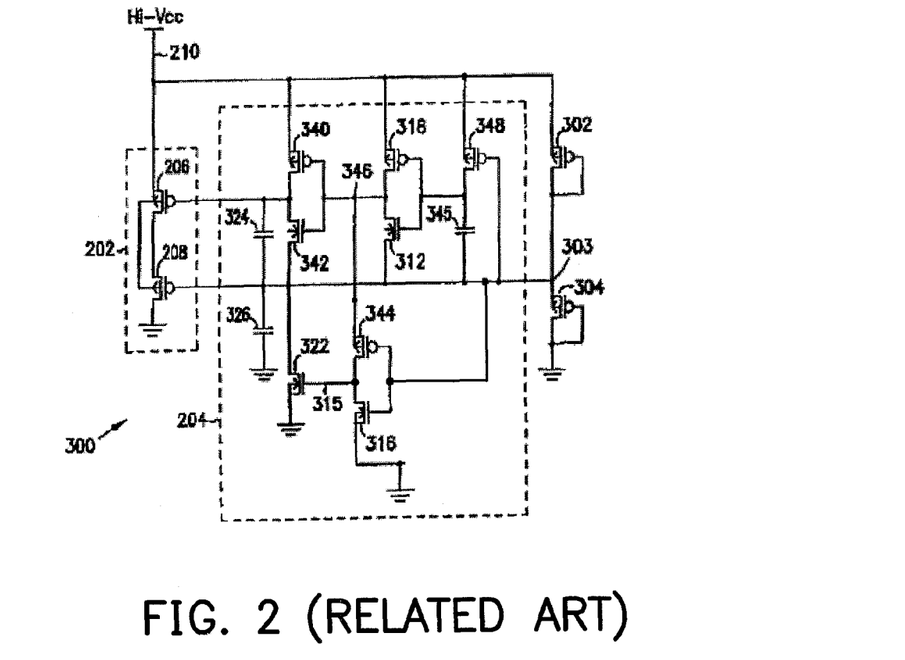

FIG. 2 shows another circuit diagram of a conventional ESD clamp circuit. The ESD clamp circuits in FIGS. 1 and 2 work in the same way. The difference between them is that the control circuit 204 in FIG. 2 is simpler.

In the conventional process, there is less leakage current of the circuit elements. Referring to the circuits in FIGS. 1 and 2, the leakage current of the control circuits 204 and the discharge paths 202 is not obvious, so the voltage divider requires providing too much driving current. Therefore, the entire leakage current of the ESD clamp circuit is not severe.

However, in the nanometer advance process nowadays, due to the shrink of the size in the low-voltage elements, the leakage current of the control circuit 204 and the discharge path 202 increases tremendously, thereby the voltage divider has to provide large driving current to maintain the correct divided voltage, such as maintaining the voltage value of node 303 as VDD. Because the voltage divider requires providing large driving current and the voltage divider includes the low-voltage elements so that the leakage current of the voltage divider is more severe and consumes most of the leakage current of the entire ESD clamp circuit; in addition, the layout area occupied by the voltage divider cannot be reduced. Due to the leakage current, the ESD clamp circuits used in advance process as shown in FIGS. 1 and 2 do not meet the consideration principle of saving the energy and lowering the cost.

Figure 3:
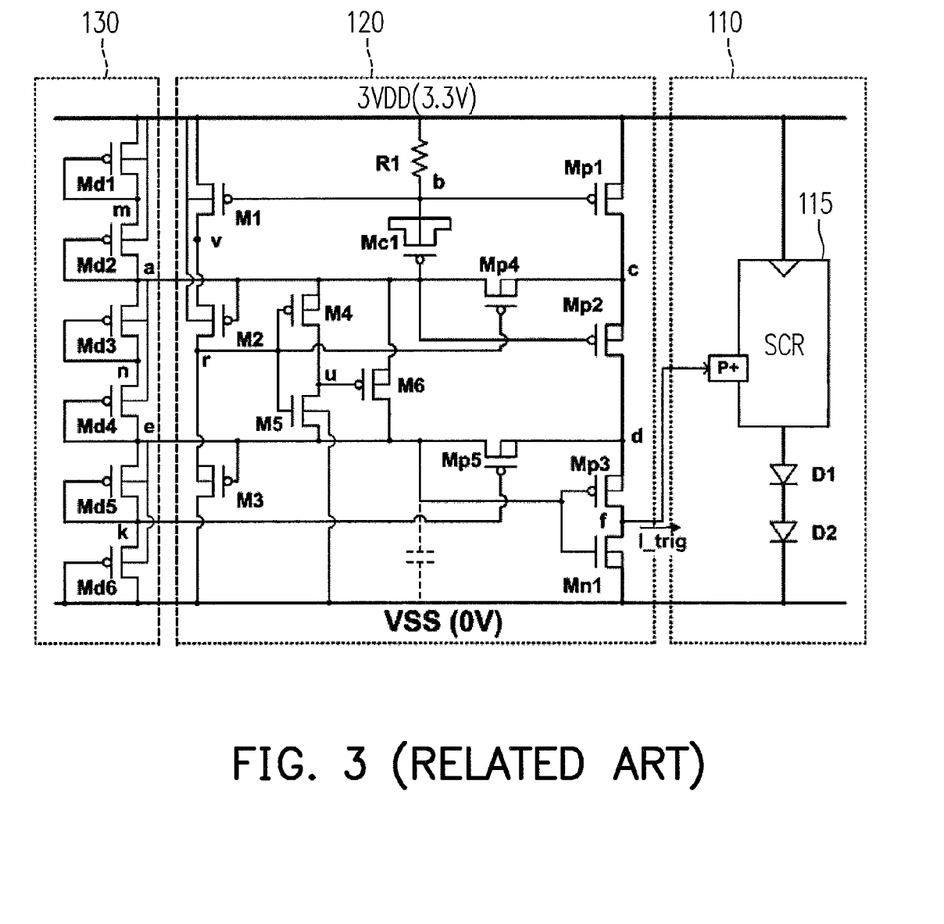

FIG. 3 shows another circuit diagram of a conventional ESD clamp circuit. The ESD clamp circuit in FIG. 3 is fabricated by low-voltage CMOS process as well. If the low-voltage elements can only endure an operation voltage which is VDD, the circuit in FIG. 3 can endure an operation voltage which is three times of VDD.

The ESD clamp circuit in FIG. 3 works in the same way as those in FIGS. 1 and 2. The ESD clamp circuit in FIG. 3 includes the discharge path 110, the control circuit 120, and the voltage divider 130, wherein the discharge path 110 includes the silicon-controlled rectifier (SCR) 115. Six diode-connected PMOS transistors Md1-Md6 in series are used in the voltage divider 130 to divide the operation voltage which is three times of VDD by three to prevent each of the low-voltage elements of the circuit in FIG. 3 from EOS. When the ESD pulse occurs, the control circuit 120 outputs trigger current I_trig, completing the discharge path 110 to conduct the ESD pulse to the ground terminal.

Because the operation principle is the same as those in FIGS. 1 and 2, the ESD clamp circuit in FIG. 3 has the same problem of severe leakage current in the advance process.

SUMMARY OF THE INVENTION

An embodiment of the invention provides high-voltage-tolerant ESD clamp circuit with low leakage current fabricated by low-voltage CMOS process, for solving the problem of the leakage current in the conventional circuit in the advance process, adapted to the electronic system with multiple operation voltages.

An embodiment of the invention provides an ESD clamp circuit including a plurality of identical module circuits, wherein an anode of the first module circuit is coupled to a power terminal of the ESD clamp circuit, an anode of each of the other module circuits is coupled to a cathode of the previous module circuit, a cathode of the last module circuit is coupled to a ground terminal of the ESD clamp circuit. Each of the module circuits comprises a conduction path and a detection circuit. The conduction path is coupled to the anode of the module circuit. The detection circuit is coupled to the anode, the cathode, and the conduction path of the module circuit. When the rising speed of the voltage at the anode of the module circuit surpasses a threshold, the detection circuit makes the conduction path conducting.

In an embodiment of the invention, the conduction path of each of the module circuits is coupled between the anode and the cathode of the module circuit, conducting an ESD pulse from the anode of the module circuit to the cathode of the module circuit In an embodiment of the invention, the ESD clamp circuit further comprises a discharge path. The discharge path is coupled between the power terminal and the ground terminal of the ESD clamp circuit to conduct an ESD pulse from the power terminal of the ESD clamp circuit to the ground terminal of the ESD clamp circuit. The conduction path of the last module circuit is coupled to the discharge path to output a trigger signal to make the discharge path conducting. The conduction path of each of the other module circuits is coupled between the anode and the cathode of the module circuit to conduct the trigger signal.

In an embodiment of the invention, each of the detection circuit comprises a PMOS transistor, a resistor, a capacitor and three inverters. A PMOS transistor is coupled between the anode of the corresponding module circuit and a first node. The resistor is coupled between the first node and a second node. The capacitor is coupled between the cathode of the corresponding module circuit and the second node. The first inverter is coupled to the second node and receives a voltage of the second node. The second inverter is coupled to the first inverter and receives an output of the first inverter. The third inverter is coupled to the first node and the second inverter and receives a voltage of the first node. The output of the third inverter makes the corresponding conduction path conducting or non-conducting.

In an embodiment of the invention, a high voltage terminal of the first inverter and a high voltage terminal of the second inverter are coupled to the first node. A low voltage terminal of the first inverter and a low voltage terminal of the second inverter are coupled to the cathode of the corresponding module circuit. A high voltage terminal of the third inverter is coupled to the anode of the corresponding module circuit. A low voltage terminal of the third inverter is coupled to an output terminal of the second inverter.

In an embodiment of the invention, the ESD clamp circuit further comprises a voltage divider. The voltage divider is coupled between the power terminal and the ground terminal of the ESD clamp circuit, and is coupled to the anode and the cathode of each of the module circuits. The voltage divider divides the voltage between the power terminal and the ground terminal of the ESD clamp circuit equally so that the voltages between the anode and the cathode of each of the plurality of the module circuits are equal.

The embodiment of the invention provides an ESD clamp circuit including a PMOS transistor, a resistor, a capacitor, three inverters and a conduction path. The PMOS transistor is coupled between the anode and the first node. The resistor is coupled between the first node and a second node. The capacitor is coupled between the second node and the cathode. The first inverter is coupled to the second node and receives a voltage of the second node. The second inverter is coupled to the first inverter and receives an output of the first inverter. The third inverter is coupled to the first node and the second inverter and receives a voltage of the first node. The conduction path is coupled to the anode, and is conducting or non-conducting according to the output of the third inverter.

The embodiment of the invention provides an ESD clamp circuit including a PMOS transistor, a responding circuit, an inverter and a conduction path. The PMOS transistor is coupled between the anode and a first node. The responding circuit is coupled to the first node, detects an ESD pulse at the anode and provides a detection result to a second node and the first node. The inverter is coupled to the first node and receives a voltage of the first node and provides a corresponding output according to the voltage of the first node and a voltage of the second node. The conduction path is coupled to the anode, and is conducting or non-conducting according to the output of the third inverter.

The ESD clamp circuit of the invention achieves voltage dividing by itself, dividing a higher operation voltage into the amount which is endurable for the low-voltage elements. Therefore, the ESD clamp circuit of the invention can be completely formed by the low-voltage elements. The ESD clamp circuit of the invention does not require additional mask for the thick gate-oxide in the process so that the processes are simplified, the yield is increased, and the cost is reduced. Therefore, the ESD clamp circuit of the invention does not require additional voltage dividing circuit so that the problem of current leakage of the conventional circuit is significantly alleviated. Each of the module circuits has the design for reducing the leakage current.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 4:
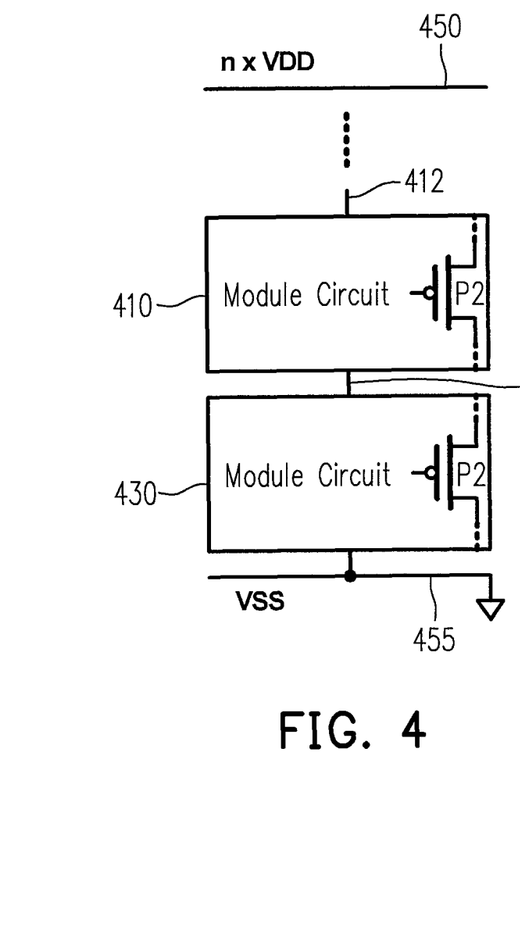
FIG. 4 shows a circuit diagram of an ESD clamp circuit according to an embodiment of the invention.
Figure 6:
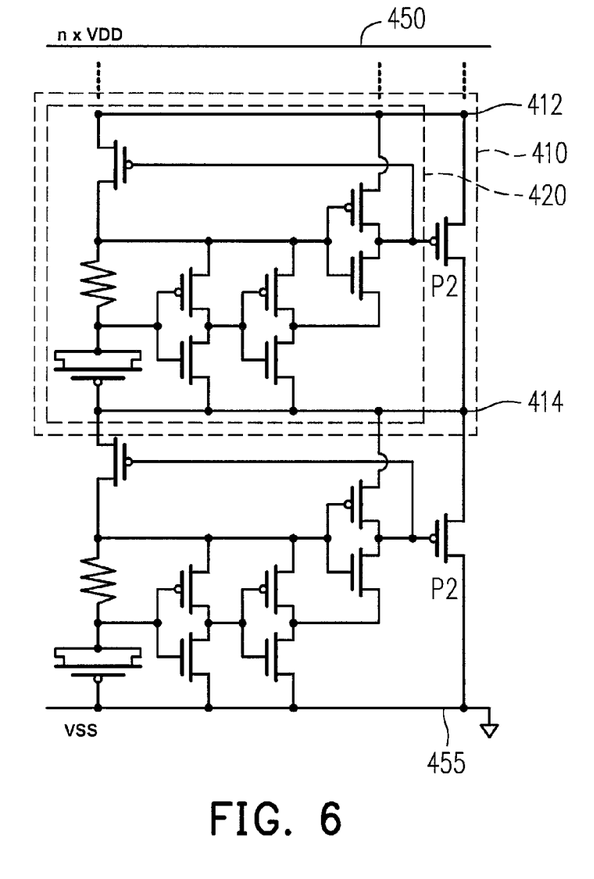
FIG. 6 shows the circuit diagram of the ESD clamp circuit in FIG. 4.

FIG. 4 shows a diagram of an ESD clamp circuit according to an embodiment of the invention. FIG. 6 shows the circuit diagram of the ESD clamp circuit in FIG. 4. The description below refers to FIGS. 4 and 6.

The ESD clamp circuit of the embodiment includes a plurality of identical module circuits, such as the module circuits 410 and 430 shown in FIG. 4 which are coupled in series; each of the module circuits has identical circuit architecture, element combination and configuration. Each of the module circuits has an anode and a cathode, for example, the module circuit 410 has the anode 412 and the cathode 414. In the identical module circuits, the anode of the first module circuit is coupled to the power terminal 450 of the ESD clamp circuit, the anode of each of the other module circuits is coupled to the cathode of the previous module circuit, and the cathode of the last module circuit is coupled to the ground terminal 455 of the ESD clamp circuit.

The ESD clamp circuit of the embodiment is completely formed by low-voltage elements. Because there are completely identical module circuits coupled in series between the power terminal 450 and the ground terminal 455 of the ESD clamp circuit. The module circuits can divide the voltage to equally divide the operation voltage provided by the power terminal 450 into the amount which is endurable for the low-voltage elements. For example, assuming the operation voltage of each of the low-voltage elements in the design phase is VDD. The operation voltage of the ESD clamp circuit is n times of VDD, and n is a positive integer more than 2. The ESD clamp circuit can include n module circuits so that the voltages across each of the module circuits are divided as VDD. Therefore, each of the low-voltage elements can operate normally without suffering from EOS.

Due to the function of voltage dividing of the module circuit, the ESD clamp circuit of the embodiment does not require the conventional voltage dividers, such as those of 202 in FIGS. 1 and 2 and 130 in FIG. 3. The conventional voltage divider is not required, that is, the severe leakage current and large area of the conventional voltage divider no longer exist. Therefore, the problem of current leakage of the entire ESD clamp circuit is significantly alleviated, and the circuit area is also reduced.

Each of the module circuits includes a conduction path and a detection path, for example, in FIG. 6, the module circuit 410 includes the detection path 420 and the conduction path formed by the PMOS transistor P2. The PMOS transistor P2 is on or off according to the output of the detection circuit 420. The detection circuit 420 is coupled to the anode 412, the cathode 414, and the conduction path P2 of the module circuit 410. The detection circuit 420 detects the ESD pulse. If the rising speed of the voltage at the anode 412 surpasses a predetermined threshold, that is, the ESD pulse exists, then the detection circuit 420 turns on the PMOS transistor P2 to make the conduction path conducting.

As shown in FIG. 4, the conduction path P2 of each of the module circuits is coupled between the anode and the cathode of the corresponding module circuit. If the ESD pulse occurs at the power terminal 450 of the ESD clamp circuit, the detection circuit of each of the module circuits turns on the corresponding conduction path to conduct the ESD pulse from the anode of the corresponding module circuit to the cathode of the corresponding module circuit. Therefore, the ESD pulse is conducted from the power terminal 450 to the ground terminal 455 to achieve the goal of protecting the electronic system.

Figure 5:
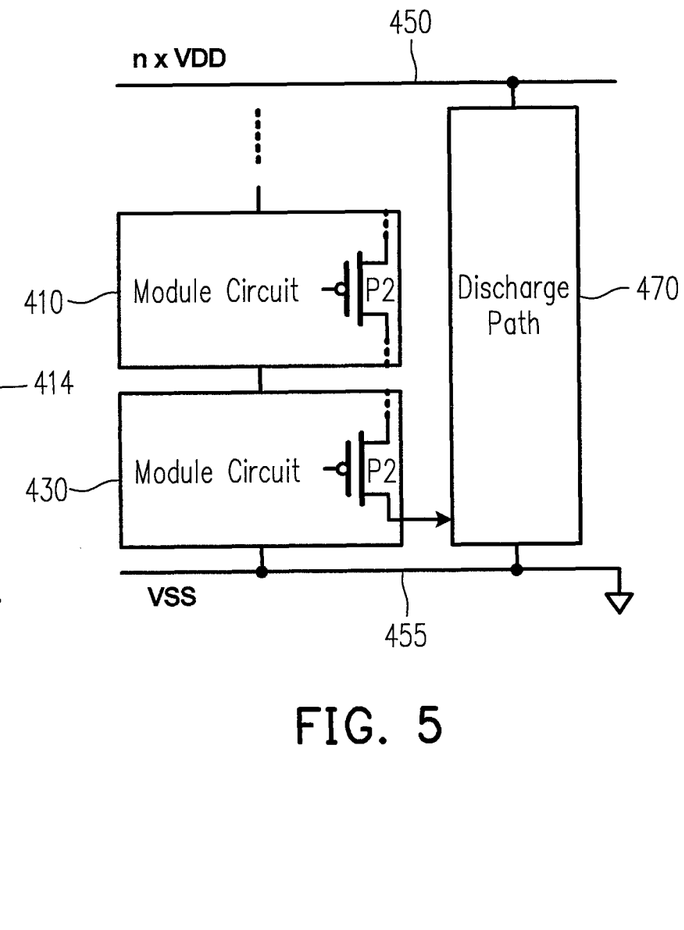
FIG. 5 shows a circuit diagram of an ESD clamp circuit according to an embodiment of the invention.
Figure 7:
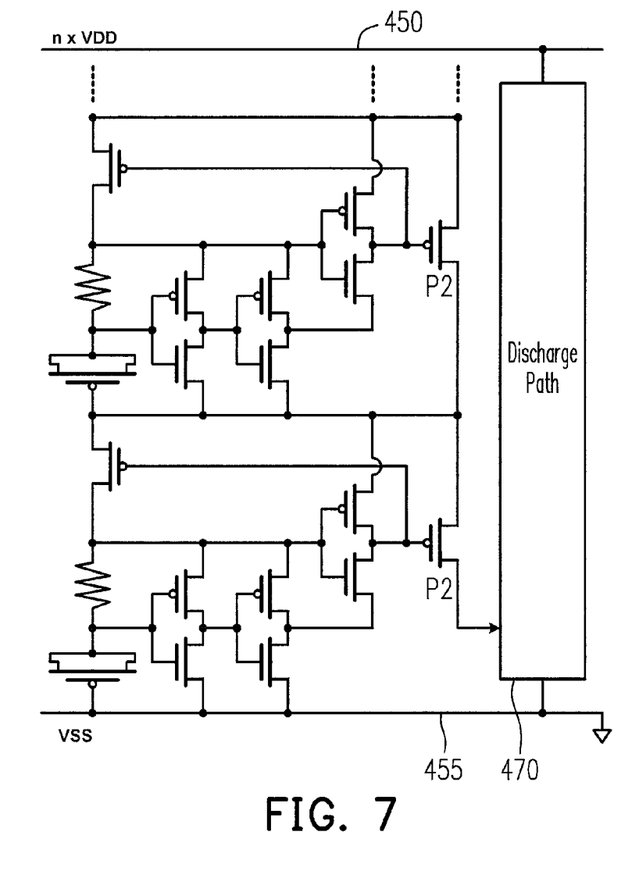
FIG. 7 shows the circuit diagram of the ESD clamp circuit in FIG. 5.

In order to reduce the leakage current, the size of such PMOS transistor P2 can be properly limited. Although the conductivity of the conduction path may be reduced, the improved design shown in FIGS. 5 and 7 can be used in the embodiment of the invention. FIG. 5 shows a diagram of an ESD clamp circuit according to another embodiment of the invention. FIG. 7 shows the circuit diagram of the ESD clamp circuit in FIG. 5. The discharge path 470 is added in the ESD clamp circuit in FIG. 5. The discharge path 470 is coupled between the power terminal 450 and the ground terminal 455 of the ESD clamp circuit. In addition to the last module circuit, the conduction path of each of the module circuits is coupled between the anode and the cathode of the corresponding module circuit, as shown in the module circuit 410. The conduction path P2 of the last module circuit is coupled between the anode and the discharge path of the corresponding module circuit, as shown in the module circuit 430. It is noted that the module circuit 430 and each of the module circuits 410 can be an identical circuit having identical circuit architecture and element combination.

When the ESD pulse occurs at the power terminal 450 of the ESD clamp circuit, the detection circuit in each of the module circuits makes the corresponding conduction path conducting. The ESD pulse causes the trigger signal. The trigger signal is conducted along the conduction path of each of the module circuits to the discharge path 470, and then turns on the discharge path 470 to conduct the ESD pulse from the power terminal 450 of the ESD clamp circuit to the ground terminal 455 of the ESD clamp circuit. Such trigger signal can be a current signal or a voltage signal. The discharge path 470 can be formed by the devices such as the silicon controlled rectifier (SCR) or the field-oxide device (FOD). If the discharge path 470 utilizes the devices without FOD, such as SCR, then the current leakage can be omitted, also the conductivity can be improved and the current leakage can be reduced.

Figure 8:
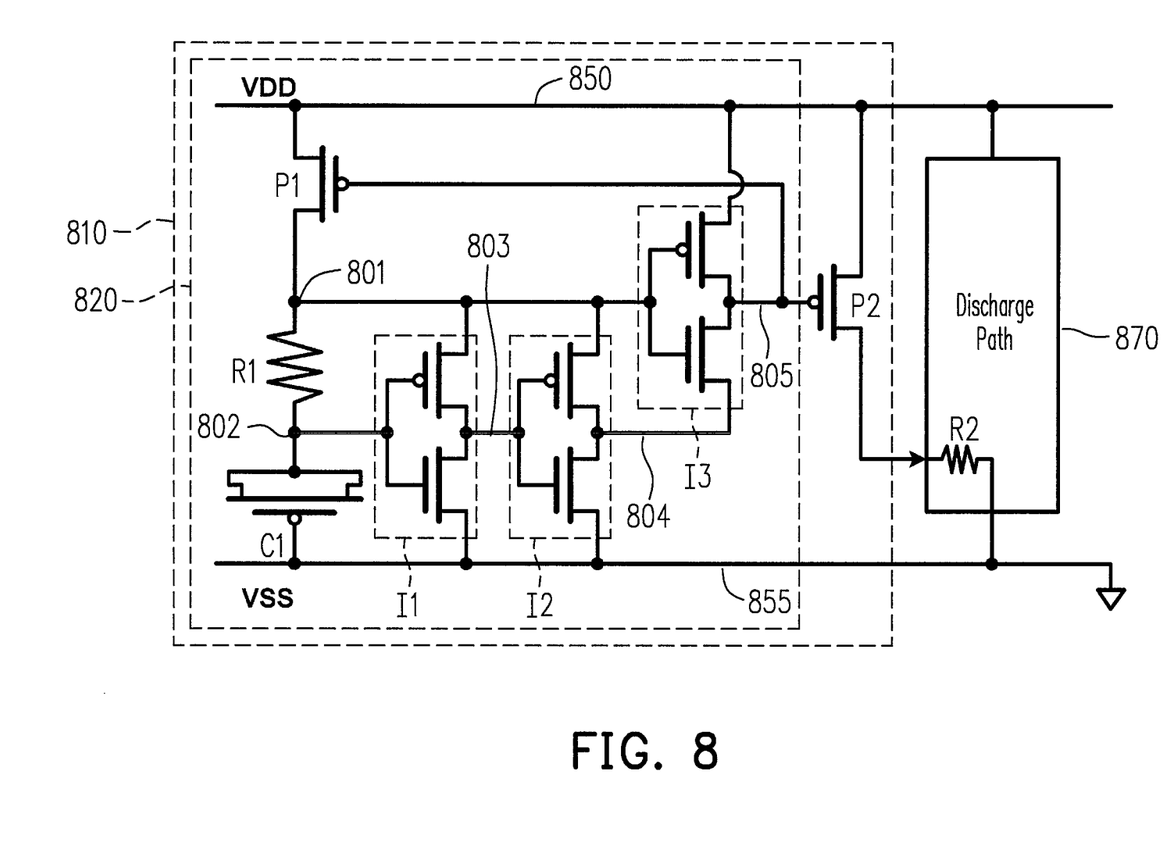
FIG. 8 shows a circuit diagram of an ESD clamp circuit according to another embodiment of the invention.

The details and the operation principle of the detection circuit in an embodiment of the invention will be described with the FIG. 8-11. FIG. 8 shows a circuit diagram of an ESD clamp circuit according to the embodiment of the invention. For simplicity, the ESD clamp circuit in FIG. 8 only includes a module circuit 810. The module circuit 810 includes the detection circuit 820 and the conduction path formed by the PMOS transistor P2. 850 is the common power terminal of the ESD clamp circuit and the module circuit 810, and 855 is the common ground terminal of the ESD clamp circuit and the module circuit 810.

The detection circuit 820 includes the PMOS transistor P1, the resistor R1, the capacitor C1, and the three inverters I1, I2, I3. Each of the inverters has four terminals, such as the input terminal, the output terminal, the high voltage terminal, and the low voltage terminal. The high voltage terminal is the source of the PMOS transistor of the inverter. The low voltage terminal is the source of the n-channel metal oxide semiconductor field effect (NMOS) transistor of the inverter. The PMOS transistor P1 is coupled between the power terminal 850 and the node 801. The resistor R1 is coupled between the node 801 and the node 802. The capacitor C1 is coupled between the node 802 and the ground terminal 855. The resistor R1 and the capacitor C1 can form a responding circuit, and the node 801 and 802 are respectively regarded as a first node and a second node. The high voltage terminal of the inverter I1 is coupled to the node 801. The low voltage terminal of the inverter I1 is coupled to the ground terminal 855. The input terminal of the inverter I1 is coupled to the node 802 and receives the voltage of the node 802. The output terminal of the inverter I1 is coupled to the node 803 and provides the voltage of the node 803. The high voltage terminal of the inverter I2 is coupled to the node 801. The low voltage terminal of the inverter I2 is coupled to the ground terminal 855. The input terminal of the inverter I2 is coupled to the node 803 and receives the voltage of the node 803. The output terminal of the inverter I2 is coupled to the node 804 and provides the voltage of the node 804. The inverters I1 and I2 can be regarded as a combinational circuit. The high voltage terminal of the inverter I3 is coupled to the node 850. The low voltage terminal of the inverter I3 is coupled to the ground terminal 804. The input terminal of the inverter I3 is coupled to the node 801 and receives the voltage of the node 801. The output terminal of the inverter I3 is coupled to the node 805 and provides the voltage of the node 805. The voltage of the node 805 is the gate voltage of the PMOS transistor P2. Therefore, the output of the inverter I3 can complete or cut off the conduction path P2.

Figure 9:
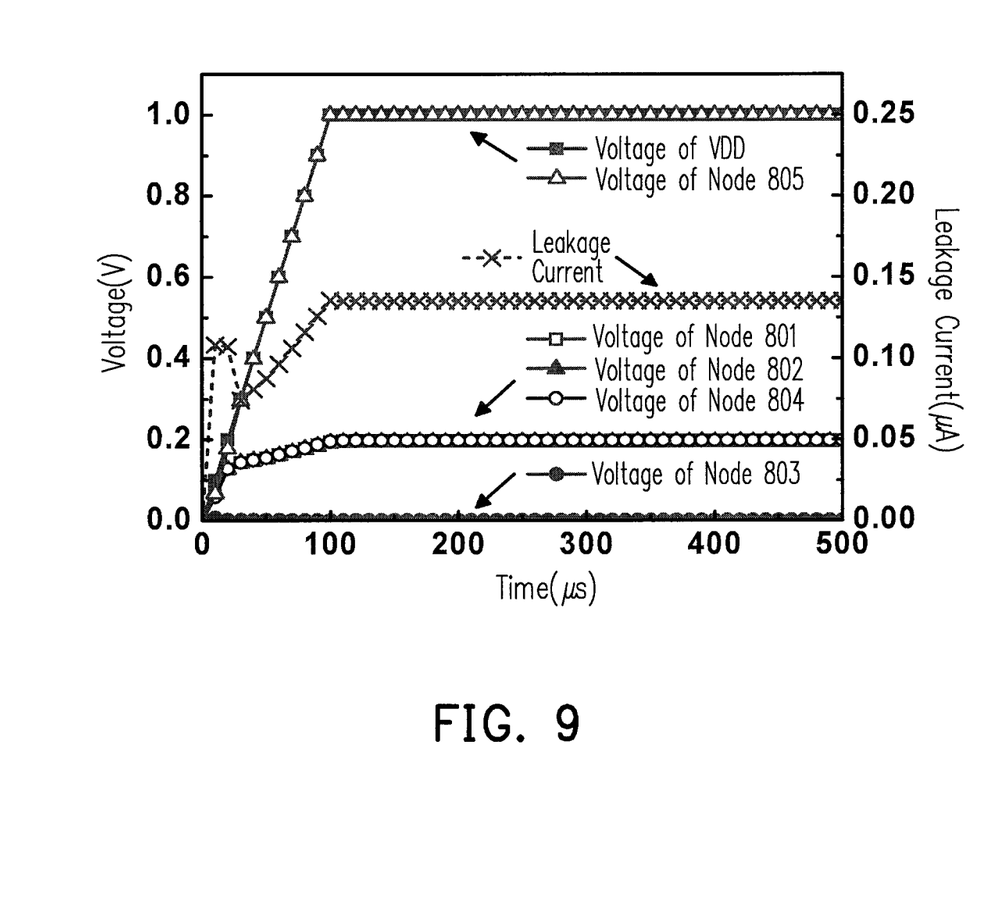
FIG. 9 shows each of the voltages of the nodes and the leakage current in FIG. 8 when the ESD clamp circuit starts normally.

The detection circuit 820 distinguishes between the normal operation voltage and the sudden ESD pulse by the charging speed of the capacitor C1; such charging speed can be equivalent to a threshold (threshold speed) defining the rising speed of the voltage of the anode. According to the embodiment having typical parameters, FIG. 9 shows the operation voltage VDD, the voltages of the nodes 801-805, and the leakage current of the module circuit 810 of the ESD clamp circuit when the ESD clamp circuit starts normally. When the ESD clamp circuit starts normally, the operation voltage VDD provided by the power terminal 850 rises from 0V to 1V in 100 microseconds so that the rise in VDD turns on the transistor P1. At this moment, the rising speed of VDD is lower than the predetermined threshold speed in the design phase. The charging speed of the capacitor C1 can follow the rising speed of VDD. Therefore, the voltages of node 801 and 802 rise simultaneously. For the inverter I1 and I2, the voltage of the node 801 is logic high and the voltage of the node 802 is also logic high. Therefore, the inverter I1 receives the logic high potential of the node 802 and outputs the logic low potential of the node 803. The inverter I2 receives the logic low potential of the node 803 and outputs the logic high potential of the node 804. But for the inverter I3, the operation voltage VDD of the power terminal 850 is logic high. The voltages of the node 801 and 804 are only 0.2V and are logic low compared with the operation voltage VDD. Hence, the NMOS transistor of the inverter I3 is off and the PMOS transistor is on so that the voltage of the node 805 equals to or about to the operation voltage VDD such that the PMOS transistor P2 of the conduction path is off without conducting the trigger current which completes the discharge path 870.

The PMOS transistor P1 is for the low leakage current design of the detection circuit 820. When the ESD clamp circuit starts normally, the voltage of the node 805 increases gradually, so that the PMOS transistor P1 is turned off in the end to stop the capacitor C1 from being charged. As shown in FIG. 9, the capacitor C1 is charged until the voltage of that is 0.2V which is not much compared with the operation voltage VDD which is 1V. Accordingly, the leakage current of the capacitor C1 and the entire module circuit 810 can be reduced. As shown in FIG. 9, the leakage current of the module circuit 810 is less than 0.15 μA. Therefore, it is not required to particularly use thick gate oxide for the capacitor C1 in order to reduce the leakage current. Accordingly, the circuit area can be reduced.

Figure 10:
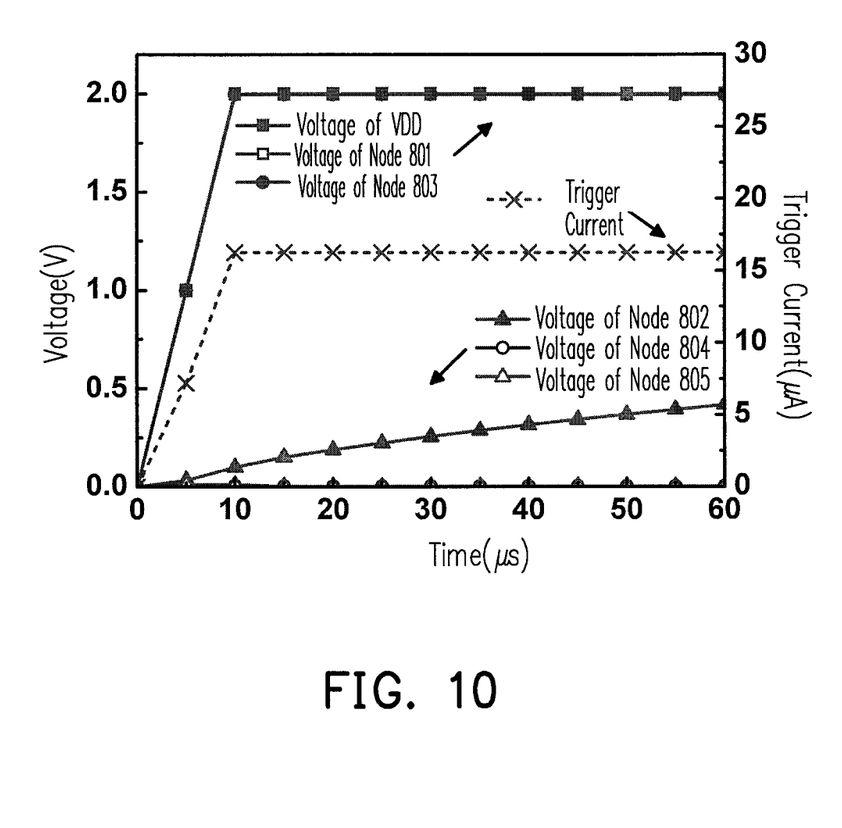
FIG. 10 and FIG. 11 show the voltages of each of the nodes and the leakage current when the ESD pulse occurs in the ESD clamp circuit in FIG. 8.

FIG. 10 shows the operation voltage VDD, the voltages of the nodes 801-805, and the trigger current outputted by the conduction path P2 of the ESD clamp circuit when the ESD pulse occurs. The ESD pulse makes the operation voltage VDD rise from 0V to 2V in 10 nanoseconds. The rise in VDD turns on the PMOS transistor P1. At this moment, the rising speed of VDD is higher than the predetermined threshold speed in the design phase. The charging speed of the capacitor C1 can not follow the rising speed of VDD. Therefore, the voltage of node 801 and the operation voltage VDD rise simultaneously, but the voltage of the node 802 does not. For the inverter I1 and I2, the voltage of the node 801 is logic high and the voltage of the node 802 is logic low. Therefore, the inverter I1 receives the logic low potential of the node 802 and outputs the logic high potential of the node 803. The inverter I2 receives the logic high potential of the node 803 and outputs the logic low potential of the node 804. For the inverter I3, the voltages of the power terminal 850 and the node 801 are logic high, and the voltage of the node 804 is logic low. Hence, the PMOS transistor of the inverter I3 is off, and the NMOS transistor is on and lowers the voltage of the node 805 such that the PMOS transistor P2 of the conduction path is on with conducting the trigger current which completes the discharge path 870.

Figure 11:
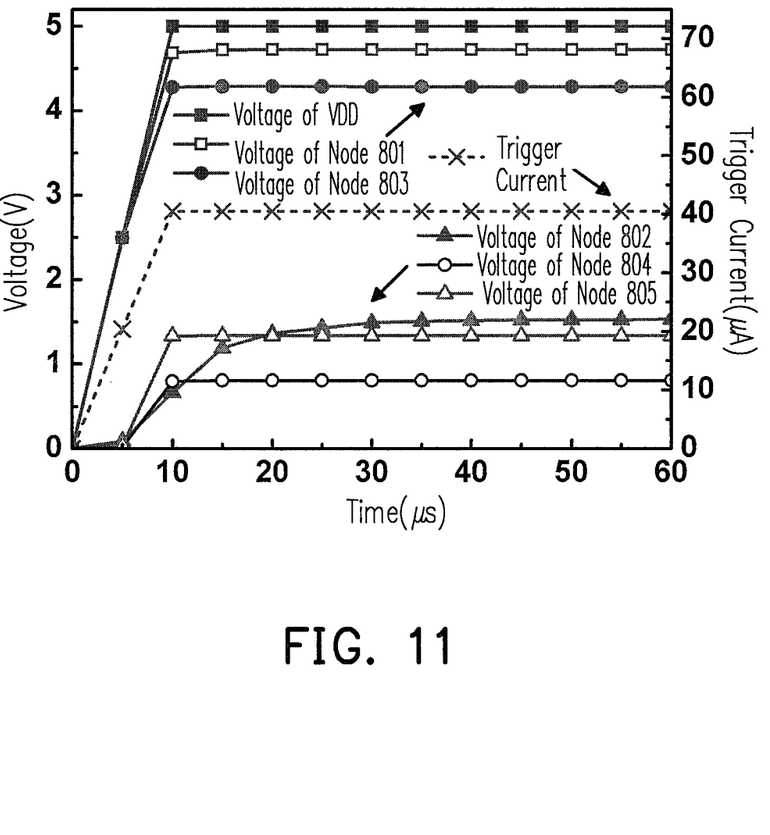

FIG. 11 shows the operation voltage VDD, the voltages of the nodes 801-805, and the trigger current outputted by the conduction path P2 of the ESD clamp circuit when the stronger ESD pulse occurs. The ESD pulse in FIG. 11 makes the operation voltage VDD rise from 0V to 5V in 10 nanoseconds. The circumstances in FIGS. 11 and 10 are similar, so the details are not repeated herein.

Figure 12:
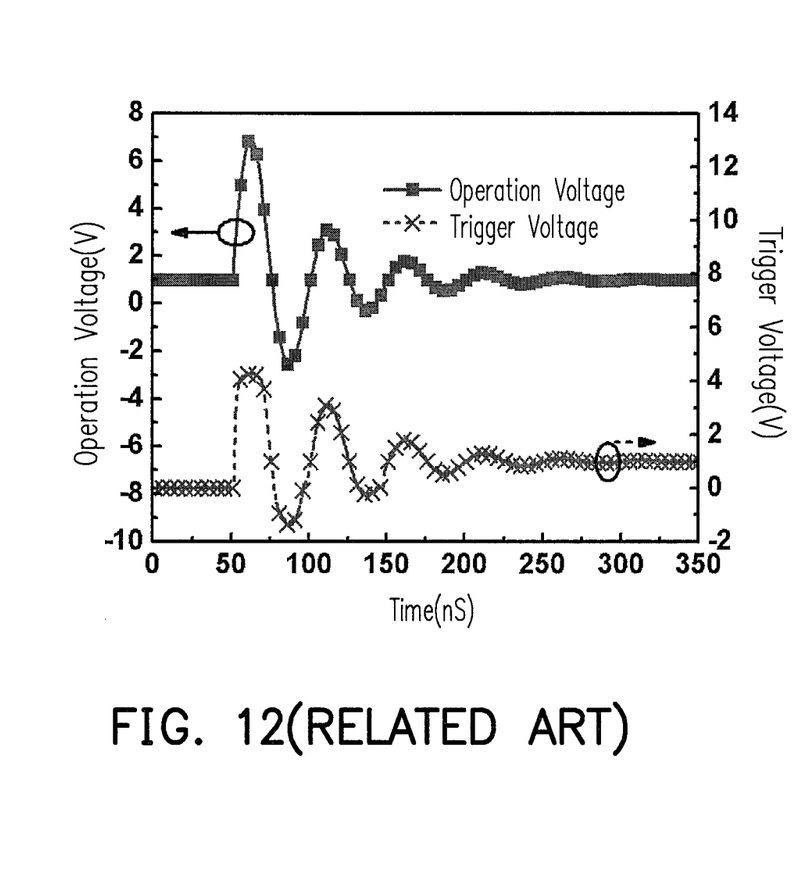
FIG. 12 shows the operation voltage and the trigger voltage when the power noise occurs in a conventional ESD clamp circuit.
Figure 13:
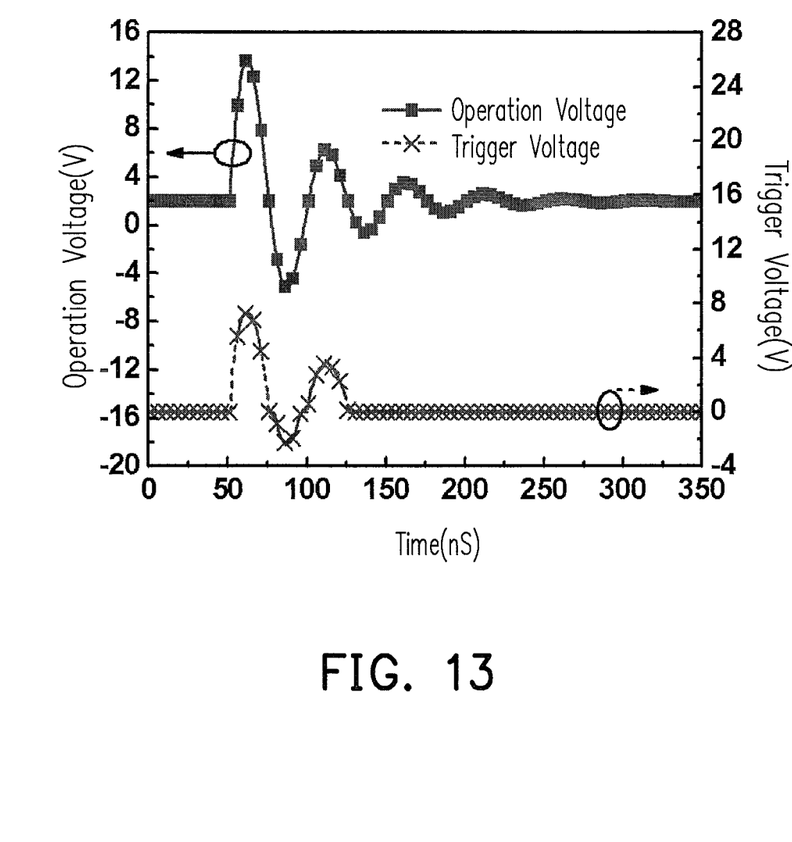
FIG. 13 shows the operation voltage and the trigger voltage when the power noise occurs in the ESD clamp circuit in FIG. 8.

As show in FIG. 12, after the noise occurs in the operation voltage VDD, in some conventional ESD clamp circuit, the trigger voltage for completing the discharge path does not return to 0V but is latched, and maintains a non-zero voltage (about 1V in the embodiment of FIG. 12). The latch causes the continuity of the current leakage of the circuit which is unsatisfying. On the other hand, the embodiment of the invention in FIG. 8 has no such latch problem. As shown in FIG. 13, the noise in the operation voltage VDD turns on the PMOS transistors P1 such that the trigger voltage (the voltage across the resistor R2) is provided. After the discharge path of the resistor R1 and the capacitor C1 discharges, each of the voltages of the nodes returns to the voltage levels before the noise occurs, and after the noise disappears, the PMOS transistors P1 and P2 is off so that the trigger voltage returns to 0V.

The ESD clamp circuit of such embodiment can divide the voltage without additional voltage dividing circuit. However, even the voltage divider is added, the operation of the ESD clamp circuit of such embodiment will not be affected. For example, in the embodiment of FIGS. 4 and 5, a voltage divider (not shown) can be added beside the plurality of module circuits to provide the current which drives each of the module circuits. The voltage divider can be coupled between the power terminal 450 and the ground terminal 455 of the ESD clamp circuit and can be coupled to the anode and the cathode of each of the module circuits, for example, being coupled to the anode 412 and the cathode 414 of the module circuit 410. As describes above, the voltage divider divides the voltage between the power terminal and the ground terminal of the ESD clamp circuit equally so that the voltages between the anode and the cathode of each of the plurality of the module circuits are equal. For example, if n module circuits are applied in the electronic system of n times of VDD, the voltage divider can include n identical voltage dividing elements (such as resistors, diodes, or transistors). The two nodes of each of the voltage dividing elements which is coupled in series respectively are coupled to the anode and the cathode of the corresponding circuit 410. Because the module circuit in such embodiment can divide the voltage itself, such voltage divider does not require strong driving ability so that the problem of severe leakage current is alleviated and large layout area is not required.

In summary, the ESD clamp circuit of the invention is fabricated by low-voltage CMOS process completely and is high-voltage-tolerant so that the elements of the ESD clamp circuit do not suffer from EOS. Therefore, the ESD clamp circuit of the invention is adapted to the electronic system with multiple operation voltages. Because the ESD clamp circuit of the invention is fabricated by low-voltage CMOS process completely, the ESD clamp circuit of the invention does not require additional mask for the thick gate-oxide so that the processes are simplified, the yield is increased, and the cost is reduced. The ESD clamp circuit of the invention does not require conventional voltage divider so that the leakage current is lowered and the circuit area is also reduced. In addition, the module circuits of the ESD clamp circuit of the invention is design for lowering the leakage current and reducing the area. In addition, the module design idea of the invention makes the identical module circuits adapted to different electronic systems with different operation voltages. In the embodiment of FIGS. 4 and 5, other circuits can be added between the module circuit 430 and the ground terminal 455; and related circuits can be added between the anode 412 of the first module circuit and the power terminal 450.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An electrostatic discharge (ESD) clamp circuit, comprising:
a plurality of identical module circuits, wherein an anode of the first module circuit is coupled to a power terminal of the ESD clamp circuit, an anode of each of the other module circuits is coupled to a cathode of the previous module circuit, a cathode of the last module circuit is coupled to a ground terminal of the ESD clamp circuit, each of the module circuits comprising:
a conduction path, coupled to the anode of the module circuit; and
a detection circuit, coupled to the anode and the cathode and the conduction path of the module circuit, wherein when a rising speed of a voltage at the anode of the module circuit surpasses a threshold, the detection circuit makes the conduction path conducting, and the detection circuit comprises:
a PMOS transistor, coupled between the anode of the corresponding module circuit and a first node;
a resistor, coupled between the first node and a second node;
a capacitor, coupled between the cathode of the corresponding module circuit and the second node;
a first inverter, coupled to the second node and receiving a voltage of the second node;
a second inverter, coupled to the first inverter and receiving an output of the first inverter; and
a third inverter, coupled to the first node and the second inverter and receiving a voltage of the first node, wherein an output of the third inverter makes the corresponding conduction path conducting or non-conducting.

2. The ESD clamp circuit of claim 1, wherein the conduction path comprises a PMOS transistor, the PMOS transistor turns on or off according to an output of the detection circuit.

3. The ESD clamp circuit of claim 1, wherein the conduction path of each of the module circuits is coupled between the anode and the cathode of the module circuit, conducting an ESD pulse from the anode of the module circuit to the cathode of the module circuit.

4. The ESD clamp circuit of claim 1, further comprising:
a discharge path, coupled between the power terminal and the ground terminal of the ESD clamp circuit to conduct an ESD pulse from the power terminal of the ESD clamp circuit to the ground terminal of the ESD clamp circuit; wherein the conduction path of the last module circuit is coupled to the discharge path to output a trigger signal to make the discharge path conducting;
the conduction path of each of the other module circuits is coupled between the anode and the cathode of the module circuit to conduct the trigger signal.

5. The ESD clamp circuit of claim 1, wherein a high voltage terminal of the first inverter and a high voltage terminal of the second inverter are coupled to the first node, a low voltage terminal of the first inverter and a low voltage terminal of the second inverter are coupled to the cathode of the corresponding module circuit, a high voltage terminal of the third inverter is coupled to the anode of the corresponding module circuit, a low voltage terminal of the third inverter is coupled to an output terminal of the second inverter.

6. The ESD clamp circuit of claim 1, further comprising:
a voltage divider, coupled between the power terminal and the ground terminal of the ESD clamp circuit, and coupled to the anode and the cathode of each of the module circuits to divide a voltage between the power terminal and the ground terminal of the ESD clamp circuit equally so that voltages between the anode and the cathode of each of the module circuits are equal.

7. An electrostatic discharge (ESD) clamp circuit, comprising:
a first PMOS transistor, coupled between an anode and a first node;
a resistor, coupled between the first node and a second node;
a capacitor, coupled between the second node and a cathode;
a first inverter, coupled to the second node and receiving a voltage of the second node;
a second inverter, coupled to the first inverter and receiving an output of the first inverter;
a third inverter, coupled to the first node and the second inverter, and receiving a voltage of the first node; and
a conduction path, coupled to the anode, being conducting or non-conducting according to an output of the third inverter.

8. The ESD clamp circuit of claim 7, wherein the conduction path comprises a second PMOS transistor, the second PMOS transistor is turned on or off according to the output of the third inverter.

9. The ESD clamp circuit of claim 7, wherein the conduction path is coupled between the power terminal and the ground terminal to conduct an ESD pulse from the power terminal to the ground terminal.

10. The ESD clamp circuit of claim 7, further comprising:
a discharge path, coupled to the conduction path and the ground terminal to conduct an ESD pulse to the ground terminal, wherein the conduction path outputs a trigger signal to make the discharge path conducting.

11. The ESD clamp circuit of claim 7, wherein a high voltage terminal of the first inverter and a high voltage terminal of the second inverter are coupled to the first node, a low voltage terminal of the first inverter and a low voltage terminal of the second inverter are coupled to the cathode, a high voltage terminal of the third inverter is coupled to the anode, a low voltage terminal of the third inverter is coupled to an output terminal of the second inverter.

12. An electrostatic discharge (ESD) clamp circuit, comprising:
a first PMOS transistor, coupled between an anode and a first node;
a responding circuit, coupled to the first node, detecting an ESD pulse at the anode and providing a detection result to a second node and the first node;

an inverter, coupled to the first node, receiving a voltage of the first node and providing a corresponding output according to the voltage of the first node and a voltage of the second node; and a conduction path, coupled to the anode, being conducting or non-conducting according to the output of the inverter, wherein the inverter is coupled to the second node through a combinational circuit; when the responding circuit detects the ESD pulse, the responding circuit provides a voltage drop between the first node and the second node to make the combinational circuit receive an input at a logic high voltage level; when the responding circuit does not detect the ESD pulse, the responding circuit makes the combinational circuit receive the input at a logic low voltage level.

13. The ESD clamp circuit of claim 12, wherein the responding circuit comprises:

a resistor, coupled between the first node and the second node; and a capacitor, coupled between the second node and a cathode.

14. The ESD clamp circuit of claim 12, wherein the combinational circuit comprises:

a first inverter, coupled to the second node and receiving the voltage of the second node; and a second inverter, coupled to the first inverter and receiving an output of the first inverter.

* * * * *